US008154864B1

(12) United States Patent
Nearman et al.

(10) Patent No.: US 8,154,864 B1
(45) Date of Patent: Apr. 10, 2012

(54) LED DISPLAY MODULE HAVING A METALLIC HOUSING AND METALLIC MASK

(75) Inventors: Nathan L. Nearman, Brookings, SD (US); Shannon Lee Mutschelknaus, Brookings, SD (US); Matthew R. Mueller, Brookings, SD (US); Douglas P. Tvedt, Brookings, SD (US); Kent S. Miller, Brookings, SD (US); Mark D. Dennis, Dell Rapids, SD (US); John L. Hage, Sioux Falls, SD (US); Ryan J. Nielsen, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 902 days.

(21) Appl. No.: 12/229,289

(22) Filed: Aug. 21, 2008

Related U.S. Application Data

(60) Provisional application No. 60/993,908, filed on Sep. 14, 2007.

(51) Int. Cl.
*H05K 7/20* (2006.01)
*F21S 2/00* (2006.01)

(52) U.S. Cl. ......... 361/679.46; 361/679.01; 361/679.21; 361/679.54; 361/704; 361/707; 361/714; 165/104.33; 165/185; 313/46; 313/493; 313/582; 313/584; 313/587; 362/249.01; 362/249.02; 362/364; 362/368; 362/373; 362/374; 362/294; 349/56; 349/58; 349/150; 349/151; 345/39; 345/43; 345/44; 345/55

(58) Field of Classification Search ............. 361/679.01, 361/679.21, 679.46, 679.54, 690–692, 704–712, 361/720–727, 825, 816, 818, 831; 165/80.3, 165/104.33, 185; 313/40, 44–46, 48, 493, 313/582–587, 634; 345/204–206, 39, 43, 345/44, 55, 82, 87, 165, 905; 349/56, 58, 349/59, 60, 61, 62, 63, 150, 151, 20, 32, 349/73, 121, 161; 362/249.01, 249.02, 364–374, 362/294, 612; 174/15.1, 16.1, 16.3, 252, 174/260, 50.52
See application file for complete search history.

(56) References Cited

U.S. PATENT DOCUMENTS

| 2,580,666 A | | 1/1952 | Dzus |
|---|---|---|---|
| 3,584,350 A | | 6/1971 | Schenk |
| 5,004,430 A | | 4/1991 | DelGuidice et al. |
| 5,835,269 A | * | 11/1998 | Natori ........................... 359/448 |
| 5,949,581 A | * | 9/1999 | Kurtenbach et al. .......... 359/621 |
| 6,169,632 B1 | * | 1/2001 | Kurtenbach et al. .......... 359/621 |
| 6,275,220 B1 | * | 8/2001 | Nitta ............................ 345/204 |
| 6,307,527 B1 | * | 10/2001 | Youngquist et al. ............ 345/39 |
| 6,347,442 B1 | | 2/2002 | Hwang |
| 6,677,918 B2 | * | 1/2004 | Yuhara et al. .................. 345/1.3 |
| 6,816,389 B1 | * | 11/2004 | Lutz et al. ..................... 361/801 |
| 7,055,271 B2 | * | 6/2006 | Lutz et al. ....................... 40/605 |

(Continued)

FOREIGN PATENT DOCUMENTS

WO   WO 2007/037605 A1 *   4/2007

OTHER PUBLICATIONS

"U.S. Appl. No. 10/459,952, Amendment filed May 20, 2004 to Non-Final Office Action mailed May 5, 2004", 15 pgs.

(Continued)

*Primary Examiner* — Michail V Datskovskiy
(74) *Attorney, Agent, or Firm* — Schwegman, Lundberg & Woessner P.A.

(57) ABSTRACT

The present invention is a robust LED display module for use in an electronic sign which display module includes a metallic housing, a heat conductive interface panel, an LED circuit board and LEDs, and a metallic mask arranged in intimate contact and association therewith, and which components operate synergistically in concert with each other in order to evenly distribute, reduce and dissipate heat along, about and within the structure of the present invention. Display uniformity is provided by the use of major metallic structures in order to prevent warpage and to protect the geometric integrity of the LED display module.

20 Claims, 9 Drawing Sheets

U.S. PATENT DOCUMENTS

| | | | |
|---|---|---|---|
| 7,173,678 B2 * | 2/2007 | Havelka et al. | 349/58 |
| 7,315,451 B2 * | 1/2008 | Kim et al. | 361/704 |
| 7,323,808 B2 * | 1/2008 | Kim et al. | 313/44 |
| 7,599,174 B2 * | 10/2009 | Sakata et al. | 361/679.27 |
| 7,649,737 B2 * | 1/2010 | Matsuzawa et al. | 361/679.54 |
| 7,694,444 B2 * | 4/2010 | Miller et al. | 40/446 |
| 7,766,529 B2 * | 8/2010 | Hadlich et al. | 362/612 |
| 7,869,198 B1 * | 1/2011 | Nearman et al. | 361/679.01 |
| 7,876,553 B2 * | 1/2011 | Okimoto et al. | 361/679.21 |
| 2002/0122134 A1 * | 9/2002 | Kalua | 348/383 |
| 2005/0073253 A1 * | 4/2005 | Lin | 313/582 |
| 2009/0154194 A1 * | 6/2009 | Hadlich et al. | 362/612 |

OTHER PUBLICATIONS

"U.S. Appl. No. 10/459,952, Election and Response filed Feb. 4, 2004 to Office Action mailed Jan. 6, 2004", 2 pgs.

"U.S. Appl. No. 10/459,952, Non-Final Office Action mailed May 5, 2004", 4 pgs.

"U.S. Appl. No. 10/459,952, Notice of Allowance mailed Jul. 14, 2004", 3 pgs.

"U.S. Appl. No. 10/459,952, Office Action mailed Jan. 6, 2004", 4 pgs.

* cited by examiner

LED DISPLAY MODULE HAVING A METALLIC HOUSING AND METALLIC MASK

CROSS REFERENCES TO RELATED APPLICATIONS

This application claims priority from the earlier filed U.S. Provisional Application No. 60/993,908 filed Sep. 14, 2007, entitled "Metallic Module and Mask for LED Display", and is hereby incorporated into this application by reference as if fully set forth herein.

This patent application is also related to patent application Ser. No. 10/459,952 filed on Jun. 12, 2003, entitled "LED Module Latch System", which is now U.S. Pat. No. 6,816,389.

BACKGROUND OF THE INVENTION

1. Field of the Invention

The present invention is for an LED display module, and more particularly, is for an LED display module having a metallic housing and mask.

2. Description of the Prior Art

Pixel spacing for light emitting diode (LED) displays has become smaller based on the need for higher resolution. To meet this demand, the use of more LEDs per unit area is required. The increase in LED density causes increased heat generation and, therefore, higher operating temperatures with increased dramatic temperature gradients across the LED display. The increased temperatures cause faster LED degradation and failure. The greater dramatic temperature gradient decreases display brightness and color consistency, thereby degrading the viewability of an electronic sign using LED displays which are often comprised of a plurality of closely arranged LED display modules. The present invention provides for an LED display module having a metallic housing and a metallic mask with a high heat conductivity thereof. The present invention also uses cooling fins to increase surface area in order to address the previous temperature related issues by reducing the overall temperature and by increasing temperature uniformity, thus providing a clear, consistent and reliable display. Prior art plastic masks through which LEDs or LED packages extend and align therethrough expand significantly when subjected to increased temperatures of the closely spaced LEDs. Such expansion due to increased temperatures resulted in warping and disruption of display viewing at moderate or extreme angles. The use of metal masks provided by the present invention resists warping when subjected to heat and does not obstruct viewing angles. Other concerns associated with LED display modules is that of electromagnetic interference (EMI) with other electronic devices, such as caused by electronic circuitry used within an LED display module where prior art housings and masks were comprised of plastic components. The present invention provides an electrically connected groundable metallic housing and a metallic mask between which other components of the LED display module are contained, thereby preventing EMI from therein. Electronic signs using LED display modules are often used for mobile applications and must be durable to withstand the rigors of setup, teardown, and traveling. The use of an electronic sign having LED display modules with a metallic housing and a metallic mask improves module durability and offers protection of the LEDs against impact for such occasions.

SUMMARY OF THE INVENTION

The general purpose of the present invention is to provide an LED display module having a metallic housing and a metallic mask in order to evenly distribute, reduce and dissipate heat, to provide EMI protection, to provide for durability and rigidity, to increase viewability and to extend component life, as well as other benefits which may be described herein.

The present invention features a plurality of closely aligned components including, but not limited to, a housing made of a metallic material, a heat conductive interface panel, an LED circuit board having a plurality of LEDs attached thereto, and a mask made of a metallic material through which the LEDs of the circuit board extend. The rear of the metallic housing includes a plurality of cooling fins for dissipating heat from the body of the metallic housing, which heat is generated by other components including, but not limited to, the plurality of LEDs. The metallic housing also includes multiple features for accommodating the mutual fastening of components of the present invention and for accommodating the fastening of the LED display module to a mounting panel of an electronic sign. The heat conductive interface panel is aligned between the metallic housing and the LED circuit board in order to transfer LED generated heat residing in the LED circuit board for dissipation by the metallic housing in combination with dissipation provided by the cooling fins. The metallic mask fittingly accommodates the plurality of LEDs and serves to draw off heat from the LEDs which are shown as multiple colored LED packages. The use of metallic components and features which draw off and dissipate heat provides for a structurally stable device which diminishes and/or eliminates panel warpage and which provides for EMI prevention.

According to one or more embodiments of the present invention, there is provided an LED display module having a metallic housing, a heat conductive interface panel, an LED circuit board, and a metallic mask arranged preferably in intimate contact and association with each other in order to evenly distribute, reduce and dissipate heat. A plurality of fasteners extend through the intimately engaged arrangement of components to forcibly ensure sufficient mutual surface contact in order to efficiently, effectively and evenly distribute, reduce and dissipate heat. Such fastening also ensures an electrical and physical connection between the metallic housing and the metallic mask in order to effect an EMI proof enclosure as provided by the present invention. A plurality of helical spring latches located at the rear of the metallic housing are provided for attachment of the present invention to a mounting panel of an electronic sign and also to assist in heat transfer to the mounting panel.

One significant aspect and feature of the present invention is the use of a metallic material to make a housing for an LED display module.

Another significant aspect and feature of the present invention is the use of a metallic material to make a mask for an LED display module.

Yet another significant aspect and feature of the present invention is the use of a metallic material for construction of an LED display module in order to distribute, reduce and dissipate heat.

Still another significant aspect and feature of the present invention is the use of a metallic material for the construction of a robust LED display module in order to provide for rigidity, durability and geometric uniformity for an LED display module, as well as to provide for the ability to resist heat warping.

Another significant aspect and feature of the present invention is the use of a metallic material for the construction of a housing for an LED display module which construction includes cooling fins in order to distribute, reduce and dissipate heat.

Yet another significant aspect and feature of the present invention is the use of a metallic housing having a front lip which transfers and dissipates heat to the surrounding air.

Still another significant aspect and feature of the present invention is the use of fasteners, such as screws, to transfer heat between the metallic mask and the metallic housing.

Another significant aspect and feature of the present invention is the ability to attach the LED display module by the use of helical spring latch assemblies to a mounting panel of an electronic sign in order to transfer heat to the mounting panel.

Another significant aspect and feature of the present invention is the use of metallic components to distribute, reduce and dissipate heat in order to prolong the life of LEDs used in the present invention.

Another significant aspect and feature of the present invention is the use of metallic components about one or more LEDs to distribute, reduce and dissipate heat in order to prolong the life of the LEDs used in the present invention.

Another significant aspect and feature of the present invention is the use of a heat conductive interface panel aligned in intimate contact between a metallic housing and an LED circuit board to facilitate heat transfer.

Still another significant aspect and feature of the present invention is the use of a metallic housing electrically connected to a metallic mask in order to provide EMI protection.

Another significant aspect and feature of the present invention is in the construction of the present invention which construction uses a metal or a combination of metals for providing the abovementioned advantages and features, whereby the metal or metals can be cast, molded or machined or otherwise to the desired shape and size.

Yet another significant aspect and feature of the present invention is the feature in which the LED display module is designed in order to replace a multiple part assembly with a single part.

Having thus briefly described one or more embodiments of the present invention, and having mentioned some significant aspects and features of the present invention, it is the principal object of the present invention to provide a robust LED display module having a metallic housing and a metallic mask in order to reduce, distribute and dissipate heat.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
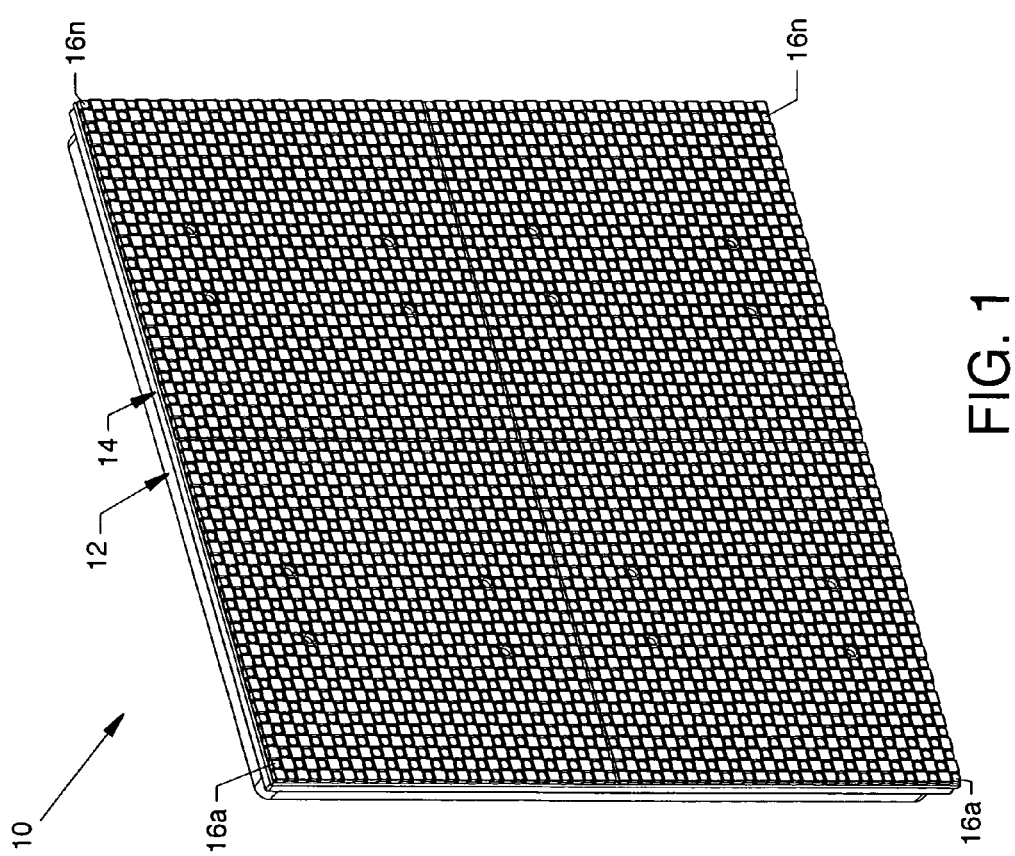
FIG. 1 is a front isometric view of an LED display module, the present invention.

FIG. 1 is a front isometric view of an LED display module 10, the present invention, having and including a metallic housing 12 and a metallic mask 14, the general shape thereof preferably being that of, but not limited to, a square. The metallic mask 14 is comprised of four closely aligned separate mask panels which are referred to unitarily as the metallic mask 14. In the alternative, the metallic mask 14 can be of single mask panel construction. A plurality of multiple color LED pixel packages are referred to herein as LEDs 16a-16n. The LEDs 16a-16n are uniformly spaced and distributed in multiple staggered rows along and about and in accommodation by the metallic mask 14, as later described in detail.

Figure 2:
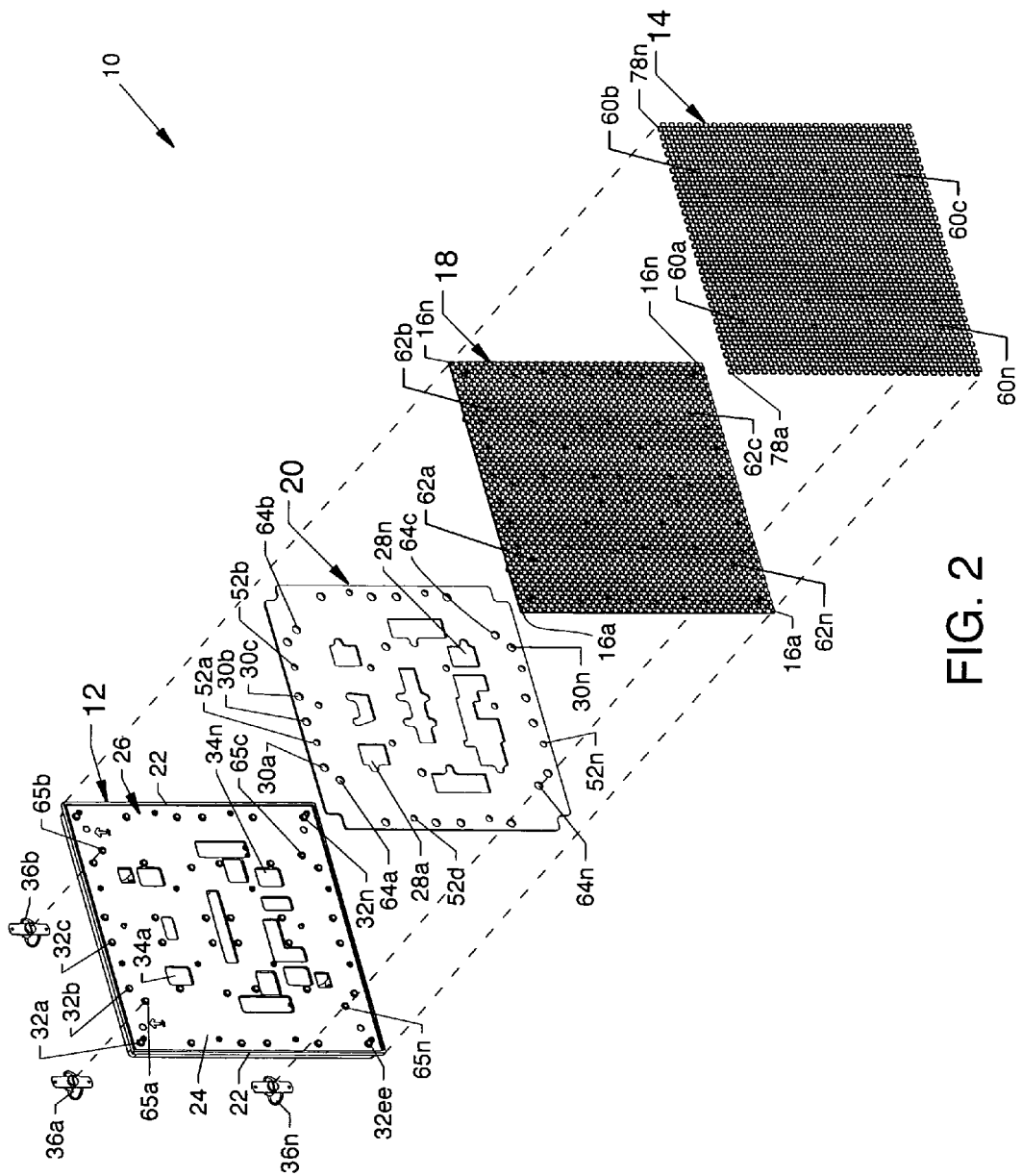
FIG. 2 is an exploded front isometric view of the LED display module of FIG. 1.

FIG. 2 is an exploded front isometric view of the LED display module 10 of FIG. 1, where all numerals correspond to those previously described. The metallic housing 12 and the metallic mask 14 are made of a metal material such as, but not limited to, magnesium or a combination of metal materials which can be molded, formed or machined to provide features conducive to heat distribution, overall heat reduction, and dissipation of heat, to provide features for EMI protection, to provide features for a robust and rigid structure, and to provide other useful features described herein. The metallic housing 12 and the metallic mask 14 are heat conductive, as well as electrically conductive. An LED circuit board 18, the front of which includes the plurality of staggered rows of LEDs 16a-16n suitably mounted thereto and the rear of which includes circuitry and electronic components for operation of the LEDs 16a-16n and a heat conductive interface panel 20, are also shown. The heat conductive interface panel 20 can be of a silicone or of a water-based thermally conductive substance. The heat conductive interface panel 20 can be a die cut pad, or in the alternative, can be a thermal paste, either of which can act as a thermally conductive interface between the LED circuit board 18 and the metallic housing 12.

The metallic housing 12 includes a continuous front lip 22 extending forwardly from the perimeter of a substantially planar body 24 to form a forwardly located recess 26 for accommodation of the heat conductive interface panel 20. The heat conductive interface panel 20 is located between the LED circuit board 18 and the metallic housing 12. The heat conductive interface panel 20 includes a plurality of openings 28a-28n for accommodation of electrical components, as well as including a plurality of body holes 30a-30n. Some of the body holes 30a-30n accommodate the forwardly located portion of a plurality of shouldered alignment posts 32a-32n located on and raised beyond the surfaces of both sides of the planar body 24 of the metallic housing 12. The heat conductive interface panel 20 includes corner cutouts to allow passage of some of the shouldered alignment posts 32a-32n which are not accommodated by the body holes 30a-30n. The shouldered alignment posts 32a-32n each include a central body hole (not shown) extending therethrough for accommodation of fastening hardware. The metallic housing 12 also includes a plurality of openings 34a-34n corresponding to openings 28a-28n of the heat conductive interface panel 20, each opening of which accommodates electrical components.

The body holes 30a-30n of the heat conductive interface panel 20 align over and about some of the forwardly located portion of the shouldered alignment posts 32a-32n in order to locate the heat conductive interface panel 20 in alignment within the recess 26 and to cause the rear surface of the heat conductive interface panel 20 to intimately contact and engage the front surface of the planar body 24 of the metallic housing 12. The front surface of the heat conductive interface panel 20 is in intimate contact with the rear surface of the LED circuit board 18. Such a relationship provides for heat transfer between the LED circuit board 18 and the metallic mask 14 to the metallic housing 12. A plurality of helical spring latch assemblies 36a-36n, referred to in U.S. Pat. No. 6,816,389 by the inventors or assignees, are secured to the rear of the metallic housing 12 for subsequent attachment of the present invention to a mounting panel of an electronic sign.

Figure 3:
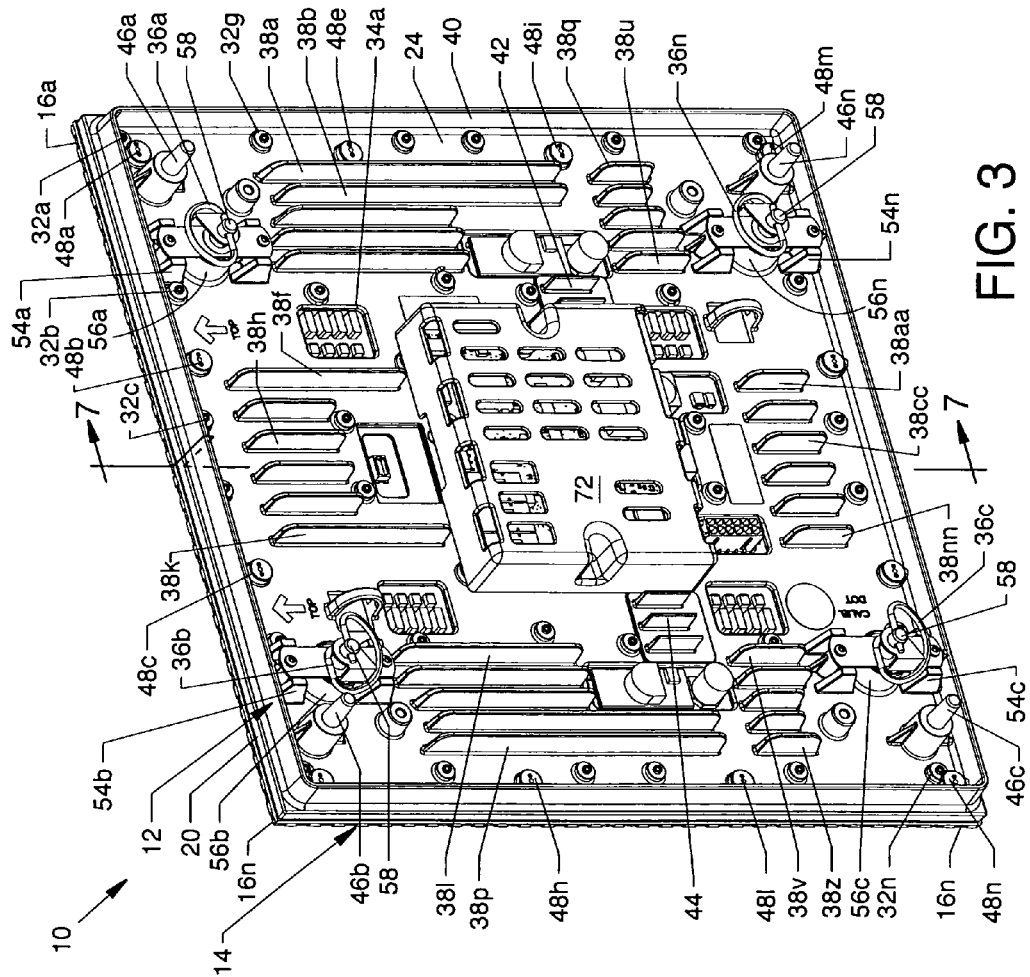
FIG. 3 is a rear isometric view of the LED display module.

FIG. 3 is a rear isometric view of the LED display module 10, the present invention, having and including the metallic housing 12 and the metallic mask 14. Features are included which distribute, reduce and dissipate heat from the LED display module 10. One such feature is a plurality of vertically oriented cooling fins 38a-38nn extending rearwardly from and distributed at various locations about the planar body 24 of the metallic housing 12. The vertical orientation of the cooling fins 38a-38nn is conducive to and promotes airflow along the cooling fins 38a-38nn to draw and dissipate heat therefrom. Another such feature which distributes, reduces and dissipates heat from the LED display module 10 is a lip-like continuous edge 40 extending rearwardly from the edge of the planar body 24 of the metallic housing 12 in opposition to the forwardly extending front lip 22. Individual cooling fins in the form of heat sinks 42 and 44 are also provided extending from the LED circuit board 18, through the heat conductive interface panel 20, and thence through the planar body 24 of the metallic housing 12.

Other features are located on or extend unitarily through the planar body 24 of the metallic housing 12 which are used for fastening, alignment and accommodation of other components, the arrangement and features of which also provide for heat distribution, reduction and dissipation. A plurality of shouldered alignment posts 46a-46n, which are aligned with corresponding holes in a mounting panel of an electronic sign, extend rearwardly from a location in close proximity to the corners of the planar body 24 of the metallic housing 12. A plurality of attachment pads 48a-48n includes forwardly facing threaded holes (not shown) which are accessible from the front side of the planar body 24 and extend rearwardly from the planar body 24 in order to accommodate the ends of a plurality of metal screws 50a-50n extending rearwardly from the LED circuit board 18 (FIGS. 5a-5b) which, where applicable, extend through a plurality of body holes 52a-52n in the heat conductive interface panel 20. The metal screws 50a-50n secure the LED circuit board 18 to the metallic housing 12, whereby the heat conductive interface panel 20 is positioned within the recess 26 to contact both the metallic housing 12 and the LED circuit board 18. The plurality of helical spring latch assemblies 36a-36n are suitably secured, such as by screws, to paired mounts 54a-54n extending rearwardly from the planar body 24 of the metallic housing 12, wherein the paired mounts 54a-54n also function as cooling fins to provide for heat distribution, reduction and dissipation. A plurality of open ended tubular collars 56a-56n extend from the rear side of the planar body 24 of the metallic housing 12 and accommodate and encompass a portion of the pivot pins 58 of the helical spring latch assemblies 36a-36n. The tubular collars 56a-56n are centrally aligned within the paired mounts 54a-54n and can also function as cooling fins to provide for heat distribution, reduction and dissipation. Actuation access to the front of the pivot pins 58 of the helical spring latch assemblies 36a-36n is provided from the front of the LED display module 10, such as by a screwdriver or other suitable tool as shown in FIGS. 5a and 5b, through a plurality of access holes 60a-60n in the metallic mask 14, a plurality of access holes 62a-62n in the LED circuit board 18, a plurality of access holes 64a-64n in the heat conductive interface panel 20, and a plurality of access holes 65a-65n (FIG. 2) co-located with the tubular collars 56a-56n.

Figure 4:
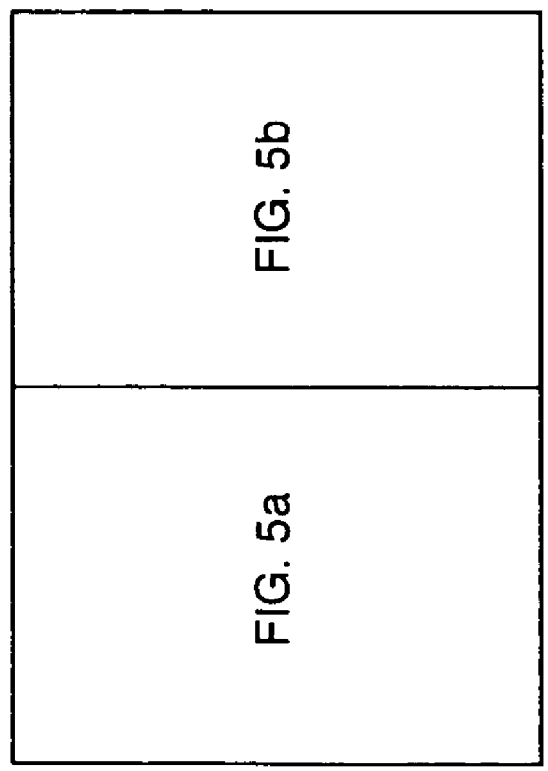
FIG. 4 shows the alignment of FIGS. 5a and 5b.
Figure 5A:
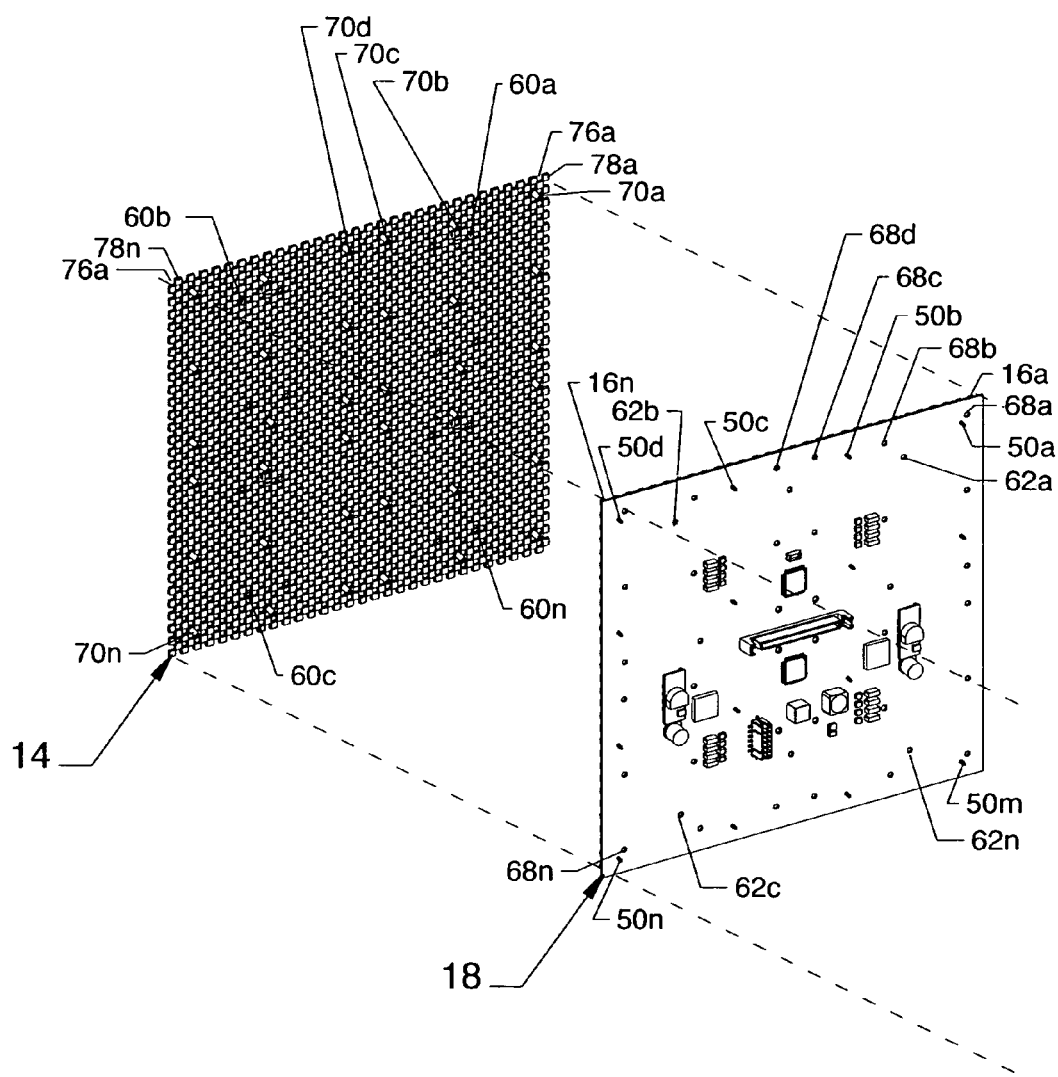
FIGS. 5a and 5b, in combination, is an exploded isometric rear view of the LED display module showing the alignment of the metallic housing, the heat conductive interface panel, the LED circuit board, the metallic mask, and other associated components and features thereof.
Figure 5B:
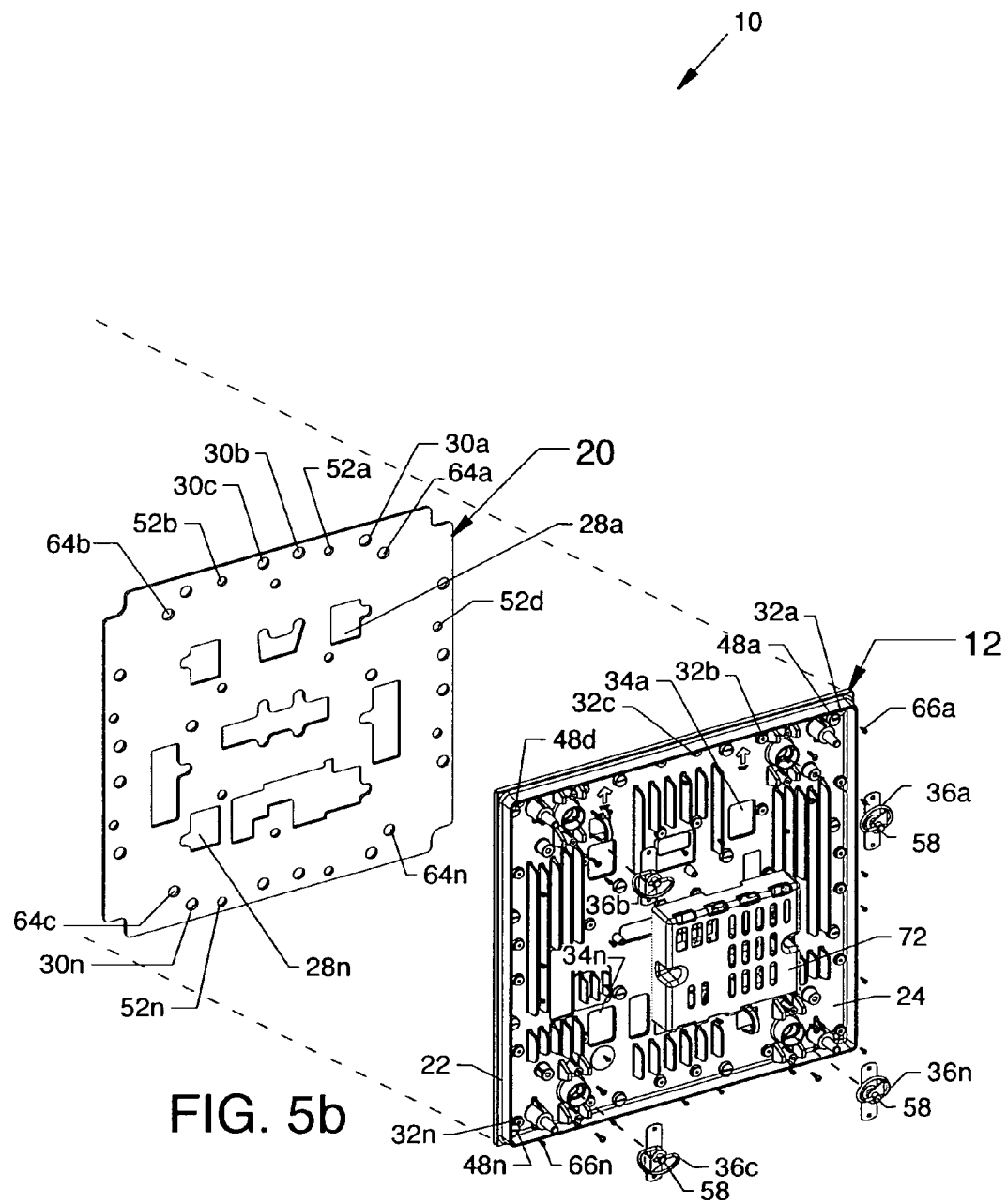

FIG. 4 shows the alignment of FIGS. 5a and 5b.

FIGS. 5a and 5b, in combination, is an exploded isometric rear view of the LED display module 10 showing the alignment of the metallic housing 12, the heat conductive interface panel 20, the LED circuit board 18, and the metallic mask 14, and other features thereof. A plurality of fasteners in the form of metal screws 66a-66n extend through the plurality of shouldered alignment posts 32a-32n of the metallic housing 12, through the body holes 30a-30n of the heat conductive interface panel 20 or through the corner cutouts thereof, through a plurality of body holes 68a-68n of the LED circuit board 18, to threadingly engage rearwardly facing holes of a plurality of cylindrical standoff mounts 70a-70n which extend rearwardly from the metallic mask 14 in order to maintain and ensure a fixed and close intimate relationship of the metallic housing 12, the heat conductive interface panel 20, the LED circuit board 18, and the metallic mask 14, and features thereof.

Each of the plurality of metal screws 66a-66n is in physical and electrical contact between the metallic housing 12 and the metallic mask 14. The plurality of screws 66a-66n physically ensures intimate engagement of associated components in order that heat transfer between components can take place. Each of the plurality of screws 66a-66n transfers heat along its length between the metallic housing 12 and through other structures to the metallic housing 12 in order to assist in heat distribution, reduction and dissipation. The electrical conductivity of the plurality of screws 66a-66n electrically connects the metallic mask 14 to the metallic housing 12, thereby forming an electronic shield about the recess 26. In order to shunt any spurious EMI to earth, the electrically connected metallic housing 12 and metallic mask 14 are grounded. A metallic component enclosure 72 mounts to the rear of the metallic housing 12 and is grounded to shunt any spurious EMI to ground.

Figure 6:
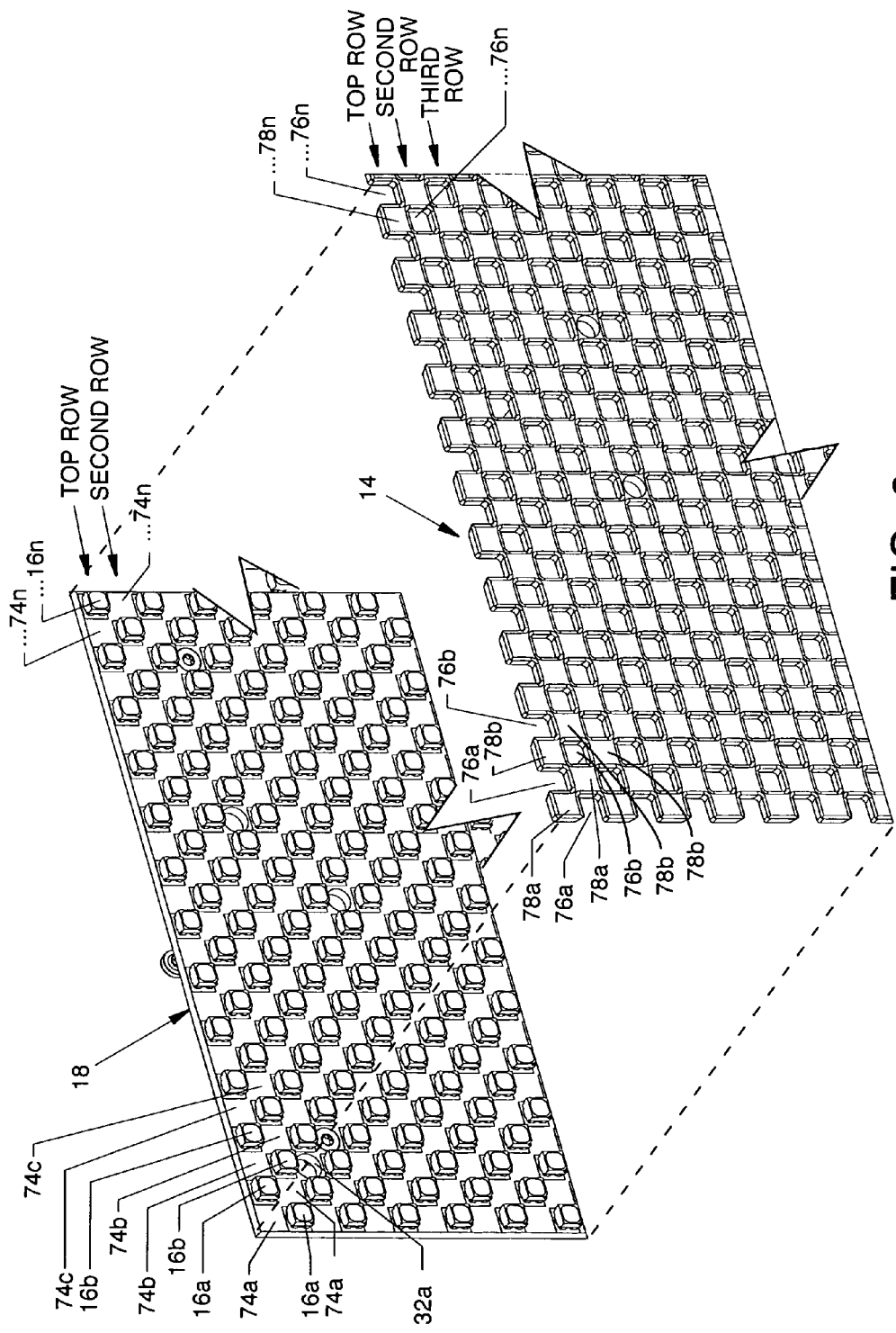
FIG. 6 is an exploded view of sections of the upper left-hand corner of the LED circuit board and the corresponding upper left-hand corner of the metallic mask demonstrating the relationship of a plurality of LEDs and the LED circuit board to the metallic mask.

FIG. 6 shows exploded sections of the upper left-hand corner of the LED circuit board 18 and the corresponding upper left-hand corner of the metallic mask 14 demonstrating the relationship of the plurality of LEDs 16a-16n and LED circuit board 18 with the metallic mask 14. The plurality of LEDs 16a-16n are arranged uniformly in alternating uniform patterns in multiple rows where each row includes one of the pluralities of LEDs 16a-16n and pluralities of surfaces 74a-74n of the LED circuit board 18 where the surfaces 74a-74n are spacingly interspersed in rows between the LEDs 16a-16n. The top row starts with a surface 74a followed by an LED 16a, and thence by a surface 74b, an LED 16b, and continues in the same pattern along the top row. The features of the second row are offset from the top row and starts with an LED 16a followed by a surface 74a, and thence by an LED 16b, a surface 74b, and continues in the same pattern along the second row. Successive rows are repeated in the same offset manner.

The metallic mask 14 is configured to accommodate the multiple rows of LEDs 16a-16n of the LED circuit board 18 in close proximity about the LEDs 16a-16n in order to absorb and transfer heat from each of the individual LEDs 16a-16n.

The metallic mask 14 is also configured to intimately engage the surfaces 74a-74n of the LED circuit board 18 in order to absorb and transfer heat therefrom. The metallic mask 14 includes rows of alternating openings 76a-76n extending through the body of the metallic mask 14 which alternate with the solid regions of the metallic mask 14, where such solid regions function as and are referenced as heat sink pads 78a-78n.

The plurality of heat sink pads 78a-78n are arranged uniformly in an alternating uniform pattern in rows where each row includes the pluralities of heat sink pads 78a-78n and the pluralities of openings 76a-76n where the openings 76a-76n are spacingly interspersed between the heat sink pads 78a-78n. The top row starts with a heat sink pad 78a, followed by an opening 76a, and thence by a heat sink pad 78b, an opening 76b, and continues in the same pattern along the top row. The features of the second row are offset from the top row and start with an opening 76a followed by a heat sink pad 78a and thence by an opening 76b, a heat sink pad 78b, and continues in the same pattern along the second row. Successive rows are repeated in the same manner.

More specifically and for example and demonstration, the surface 74a in the second row of the LED circuit board 18 maintains intimate contact with the heat sink pad 78a in the second row of the metallic mask 14. The LED 16b in the second row of the LED circuit board 18 is closely surrounded by, or in the alternative, is in intimate contact with features of the metallic mask 14, including the adjacent surrounding heat sink pad 78b in the first row, the heat sink pad 78a and 78b in the second row, and the heat sink pad 78b in the third row, in order to absorb and transfer heat from the LED 16b to the metallic mask 14 for subsequent heat transfer, distribution, reduction and dissipation. Other LEDs 16a-16n maintain a similar relationship to the LED circuit board 18 and the metallic mask 14 with the possible exception of LEDs located at the perimeter of the LED circuit board 18 which may receive slightly less benefit.

Figure 7:
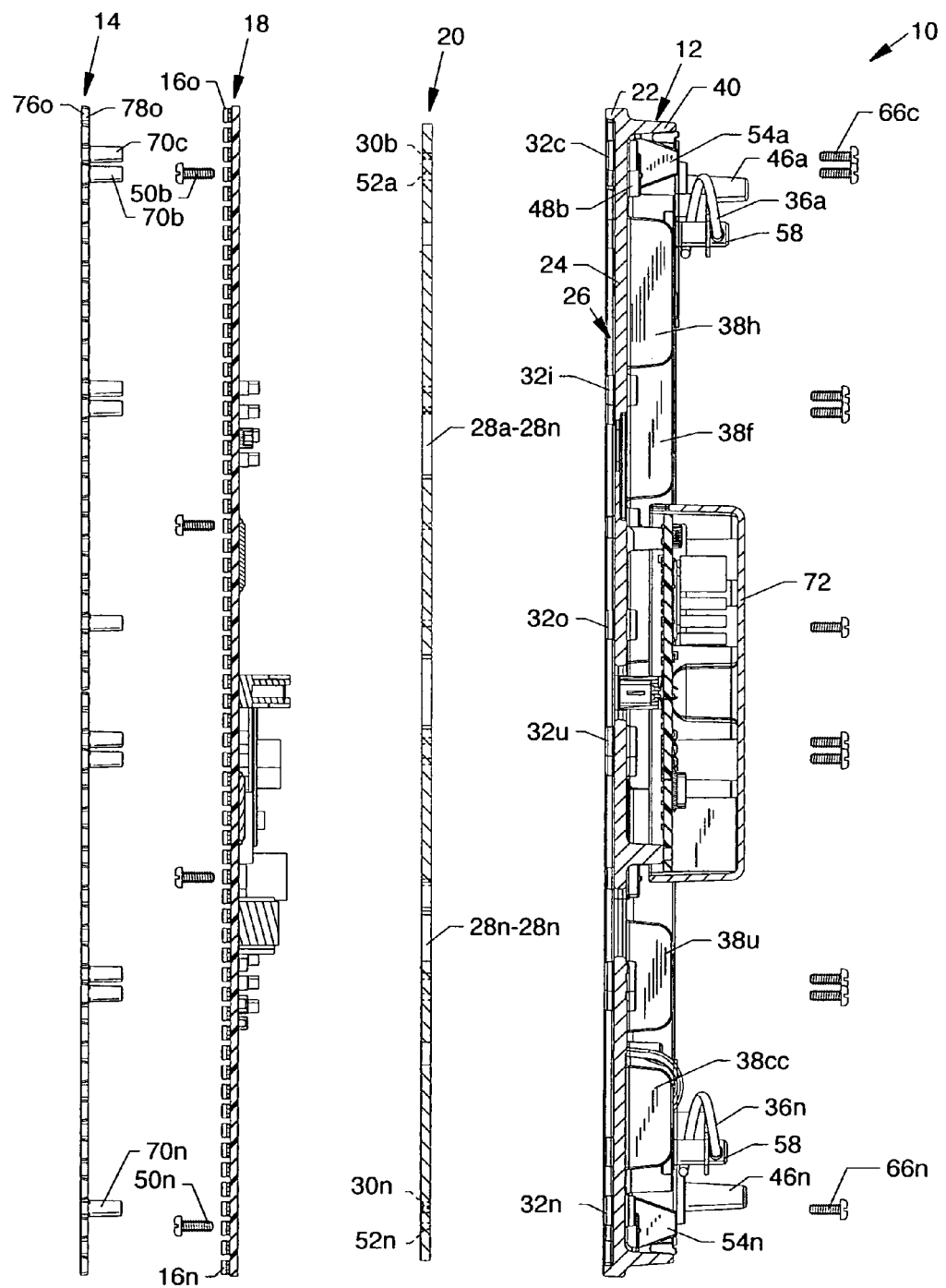
FIG. 7 is an exploded section view along line 7-7 of FIG. 3 showing the relationship of the components of the present invention; and, FIG. 8 is an assembled section view of the components of FIG. 7 showing the intimate engagement of the components of the present invention.

FIG. 7 is an exploded section view along line 7-7 of FIG. 3 showing the relationship of the components of the present invention.

Figure 8:
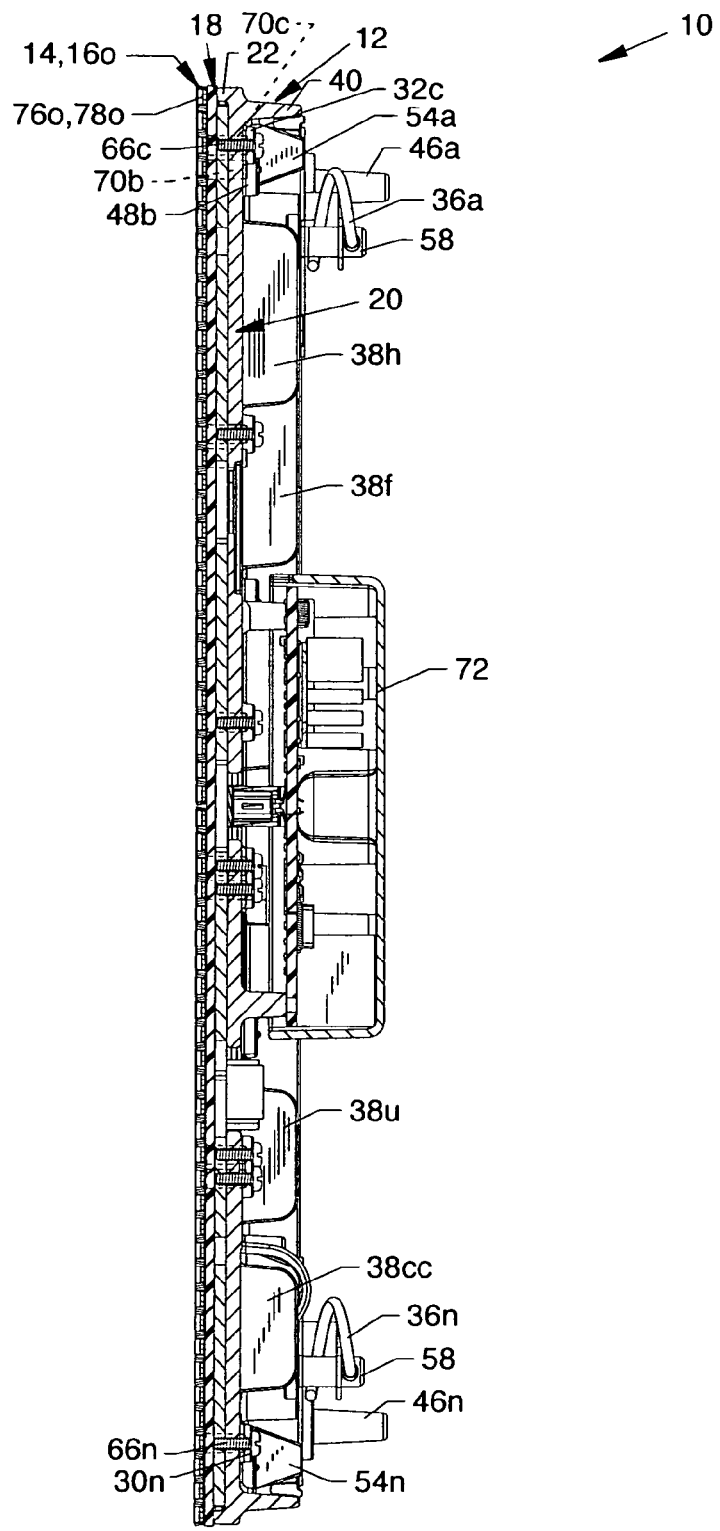

FIG. 8 is an assembled section view of the components of FIG. 7 showing the intimate engagement of the components of the present invention.

Mode of Operation

The display module 10, including the metallic housing 12, the heat conductive interface panel 20, the LED circuit board 18, and the metallic mask 14 arranged in intimate contact and association synergistically, operate in concert in order to evenly distribute, reduce and dissipate heat along, about and within the structure of the present invention. The close and intimate relationship of all of the metallic components, including the hardware and fastening devices, serves to transfer thermal energy within the present invention, as well as to provide other paths for absorption or dissipation of heat. The helical spring latch assemblies 36a-36n serve to forcibly attach the display module 10 to a mounting panel of an electronic sign where intimate engagement to the mounting panel allows the mounting panel to act as a heat absorber. The plurality of cooling fins 38a-38nn and other components provide a path to ambient air whereby heat transfer takes place therewith. Distribution, reduction and dissipation of heat from the display module 10 and the rigidity and mechanical and electrical stability provided by the use of metallic components, such as, but not limited to, the metallic housing 12 and the metallic mask 14, provides for an undistorted and unhampered viewing of the LEDs 16a-16n of the present invention. The emission of EMI from the present invention is prevented by the grounded metallic structure of the electrically connected metallic housing 12 and the metallic mask 14.

Various modifications can be made to the present invention without departing from the apparent scope thereof.

| PARTS LIST | |
|---|---|
| 10 | LED display module |
| 12 | metallic housing |
| 14 | metallic mask |
| 16a-n | LEDs |
| 18 | LED circuit board |
| 20 | heat conductive interface panel |
| 22 | front lip |
| 24 | planar body |
| 26 | recess |
| 28a-n | openings |
| 30a-n | body holes |
| 32a-n | shouldered alignment posts |
| 34a-n | openings |
| 36a-n | helical spring latch assemblies |
| 38a-nn | cooling fins |
| 40 | continuous edge |
| 42 | heat sink |
| 44 | heat sink |
| 46a-n | shouldered alignment posts |
| 48a-nn | attachment pads |
| 50a-n | screws |
| 52a-n | body holes |
| 54a-n | paired mounts |
| 56a-n | tubular collars |
| 58 | pivot pins |
| 60a-n | access holes |
| 62a-n | access holes |
| 64a-n | access holes |
| 65a-n | access holes |
| 66a-n | screws |
| 68a-n | body holes |
| 70a-n | standoff mounts |
| 72 | metallic enclosure |
| 74a-n | surfaces |
| 76a-n | spaces |
| 78a-n | heat sink pads |

It is claimed:

1. An LED display module comprising:
   a. an expansive metallic housing;
   b. an LED circuit board;
   c. a heat conductive interface panel sandwiched between said expansive metallic housing and said LED circuit board; and,
   d. an expansive metallic mask on the open side of said LED circuit board, said metallic housing, said LED circuit board, said heat conductive interface panel, and said metallic mask being joined together in an abutting relationship by metallic fastening means.

2. The LED display module of claim 1, wherein said metallic fastening means are metal screws.

3. The LED display module of claim 2, wherein said expansive metallic housing and said metallic mask are made from magnesium or from a combination of metallic materials.

4. The LED display module of claim 3, wherein said metallic housing and said metallic mask are electrically grounded.

5. The LED display module of claim 1, wherein said LED circuit board has a front planar surface and a rear planar surface, a plurality of spaced LEDs being attached to said front planar surface and extending therefrom in a patterned arrangement, and said metallic mask having a grid-like structure such that portions thereof surround said LEDs.

6. The LED display module of claim 5, wherein said patterned arrangement of spaced LEDs includes multiple rows of spaced LEDs interspersed with adjacent surface sections of said front planar surface of said LED circuit board and said grid-like structure of said metallic mask having heat sink pads on said surface sections, said heat sink pads being adjacent said spaced LEDs.

7. The LED display module of claim 6, wherein each successive row of spaced LEDs is offset from said preceding row of spaced LEDs.

8. The LED display module of claim 1, wherein said expansive metallic housing has a planar front surface and a planar rear surface and wherein said rear surface of said expansive metallic housing has a plurality of vertically oriented, spaced, cooling fins attached thereto.

9. The LED display module of claim 8, wherein said LED circuit board has a plurality of spaced heat sinks extending from the rear surface thereof and through openings in said heat conductive interface panel and said expansive metallic housing.

10. The LED display module of claim 9, wherein said expansive metallic housing has a continuous perimetrical lip extending forwardly from said front planar surface thereof towards said metallic mask and a continuous perimetrical lip extending rearwardly from said rear planar surface thereof.

11. The LED display module of claim 10, wherein said heat conductive interface panel is contained within the space formed by said front planar surface of said metallic housing and said continuous perimetrical lip extending forwardly from said front planar surface of said metallic housing.

12. The LED display module of claim 11, wherein said metallic fastening means are metal screws.

13. The LED display module of claim 12, wherein said expansive metallic housing and said metallic mask are made from magnesium or from a combination of metallic materials.

14. The LED display module of claim 13, wherein said metallic housing and said metallic mask are electrically grounded.

15. The LED display module of claim 14, wherein a plurality of spaced helical spring latch assemblies is fixed to said rear surface of said metallic housing and wherein each of said plurality of helical spring latch assemblies is actuated by a pivot pin connected thereto and accessible from the front of said metallic mask via a plurality of aligned access holes through said metallic mask, through said LED circuit board, through said heat conductive interface panel and through said metallic housing.

16. The LED display module of claim 15, wherein each of said helical spring latch assemblies is fixed to said rear surface of said metallic housing by a pair of spaced mounts which function as cooling fins.

17. The LED display module of claim 1, wherein each of said expansive metallic housing, said LED circuit board, said heat conductive interface panel, and said metallic mask is substantially square or rectangular in configuration.

18. The LED display module of claim 2, wherein said metal screws are securely spaced near and within the perimeter of said expansive metallic housing and extend therethrough and through spaced holes in said LED circuit board, through corresponding spaced holes in said heat conductive interface panel and into said metallic mask.

19. The LED display module of claim 12, wherein said metal screws are securely spaced near and within the perimeter of said expansive metallic housing and extend therethrough and through spaced holes in said LED circuit board, through corresponding spaced holes in said heat conductive interface panel and into said metallic mask.

20. An electronic display sign comprising a plurality of display modules as claimed in claim 1, wherein said display modules are arranged in adjacent juxtaposition.

* * * * *